(12) United States Patent
Mizusaki

(10) Patent No.: US 12,543,475 B2
(45) Date of Patent: Feb. 3, 2026

(54) LIGHT-EMITTING ELEMENT, DISPLAY DEVICE

(71) Applicant: Sharp Display Technology Corporation, Kameyama (JP)

(72) Inventor: Masanobu Mizusaki, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 421 days.

(21) Appl. No.: 18/275,019

(22) PCT Filed: Feb. 8, 2021

(86) PCT No.: PCT/JP2021/004589
§ 371 (c)(1),
(2) Date: Jul. 31, 2023

(87) PCT Pub. No.: WO2022/168312
PCT Pub. Date: Aug. 11, 2022

(65) Prior Publication Data
US 2024/0114715 A1 Apr. 4, 2024

(51) Int. Cl.
*H10K 59/80* (2023.01)
*H10K 50/13* (2023.01)
*H10K 50/818* (2023.01)
*H10K 50/852* (2023.01)
*H10K 59/32* (2023.01)

(52) U.S. Cl.
CPC ....... *H10K 59/80518* (2023.02); *H10K 50/13* (2023.02); *H10K 50/818* (2023.02); *H10K 50/852* (2023.02); *H10K 59/32* (2023.02); *H10K 59/876* (2023.02)

(58) Field of Classification Search
CPC ...... H10K 50/13; H10K 50/131; H10K 50/19; H10K 59/876; H10K 59/32
See application file for complete search history.

(56) References Cited

U.S. PATENT DOCUMENTS

| | | | |
|---|---|---|---|
| 2007/0024168 A1 | 2/2007 | Nishimura et al. | |
| 2014/0001457 A1 | 1/2014 | Endo | |
| 2014/0191226 A1* | 7/2014 | Yamae | H10K 50/131 257/40 |
| 2015/0194471 A1 | 7/2015 | Lee | |
| 2016/0359143 A1* | 12/2016 | Osawa | H10K 50/19 |
| 2019/0198788 A1 | 6/2019 | Park et al. | |
| 2021/0376295 A1* | 12/2021 | Zhou | H10K 59/876 |

FOREIGN PATENT DOCUMENTS

| | | | | |
|---|---|---|---|---|
| CN | 117460288 A | * | 1/2024 | ........... H10K 50/858 |
| JP | 2007-265638 A | | 10/2007 | |
| JP | 2012-195054 A | | 10/2012 | |
| JP | 2016-225221 A | | 12/2016 | |
| KR | 20170123557 A | * | 11/2017 | ....... H10K 59/80524 |

* cited by examiner

*Primary Examiner* — Mariceli Santiago
(74) *Attorney, Agent, or Firm* — ScienBiziP, P.C.

(57) ABSTRACT

A light-emitting element includes: a lower electrode that reflects light; an upper electrode that transmits and reflects light; and a lower light-emitting layer and an upper light-emitting layer both between the lower electrode and the upper electrode, wherein a first viewing angle at which light emitted by the lower light-emitting layer with a selected wavelength achieves a maximum resonance effect differs from a second viewing angle at which light emitted by the upper light-emitting layer with the selected wavelength achieves a maximum resonance effect.

20 Claims, 12 Drawing Sheets

COMPOUND GROUP B

COMPOUND GROUP C

COMPOUND GROUP D

化合物N

COMPOUND GROUP E

COMPOUND 1

COMPOUND 2

COMPOUND 3

COMPOUND 4

COMPOUND 5

COMPOUND 6

COMPOUND 7

(a)

(b)

LIGHT-EMITTING ELEMENT, DISPLAY DEVICE

TECHNICAL FIELD

The disclosure relates to, for example, light-emitting elements.

BACKGROUND ART

Patent Literature 1 Japanese Unexamined Patent Application Publication, Tokukai, No. 2012-195054 discloses a tandem organic EL element with high luminous efficiency.

SUMMARY

Technical Problem

The light-emitting element of Japanese Unexamined Patent Application Publication, Tokukai, No. 2012-195054 exhibits luminance that disadvantageously decreases by significant amounts when the viewing angle moves away from 0° (when away from the front view) (poor viewing angle properties).

Solution to Problem

The disclosure, in one aspect thereof, is directed to a light-emitting element including: a lower electrode that reflects light; an upper electrode that transmits and reflects light; and a lower light-emitting layer and an upper light-emitting layer both between the lower electrode and the upper electrode, wherein a first viewing angle at which light emitted by the lower light-emitting layer with a selected wavelength achieves a maximum resonance effect differs from a second viewing angle at which light emitted by the upper light-emitting layer with the selected wavelength achieves a maximum resonance effect.

Advantageous Effects of Invention

The disclosure, in an aspect thereof, improves the viewing angle properties of a light-emitting element.

DESCRIPTION OF EMBODIMENTS

Figure 1:
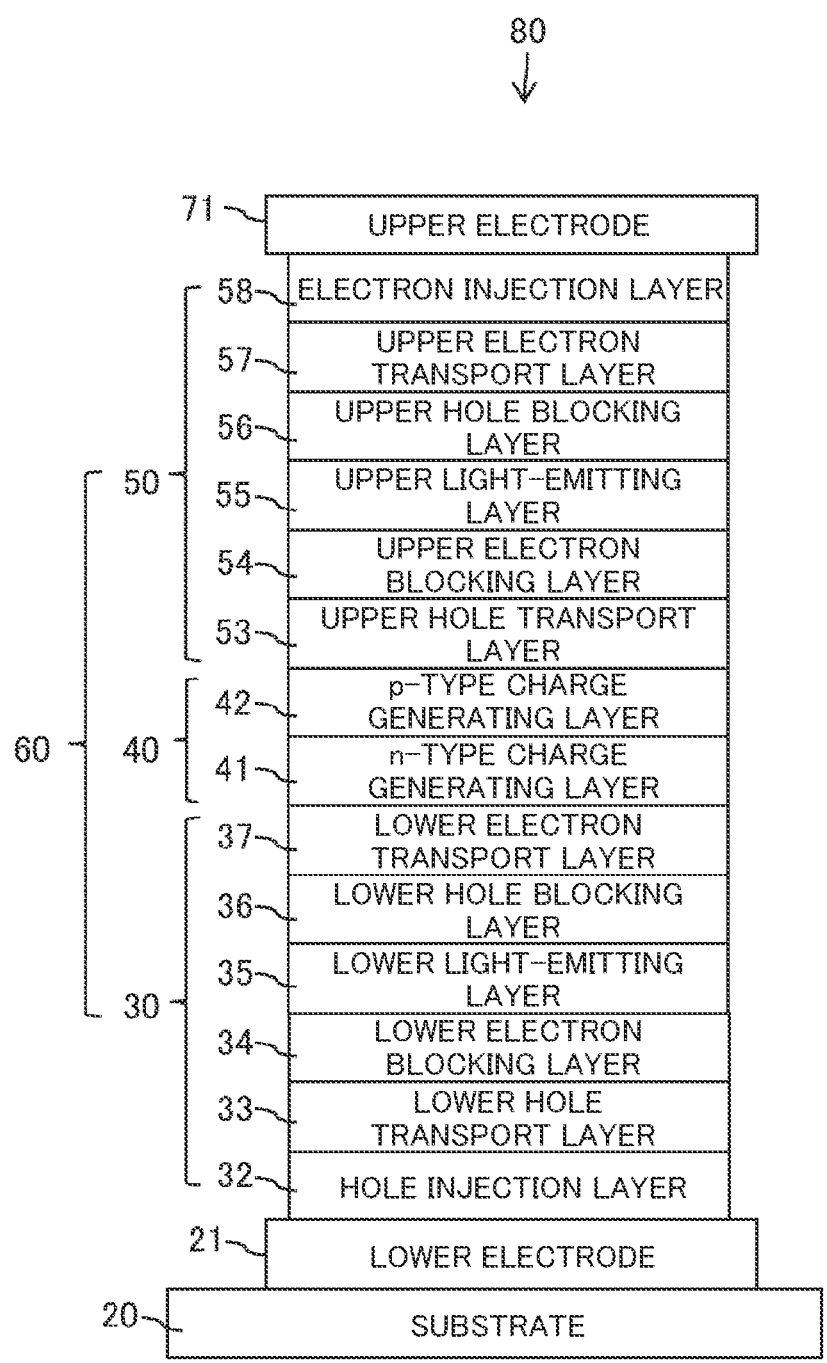
FIG. 1 is a cross-sectional view of a structure of a light-emitting element in accordance with the present embodiment.

FIG. 1 is a cross-sectional view of a structure of a light-emitting element in accordance with the present embodiment. As shown in FIG. 1, a light-emitting element 80 in accordance with the present embodiment is a top-emission type (structure in which light is extracted through the upper side) that includes a lower electrode 21, a hole injection layer 32, a lower hole transport layer 33, a lower electron blocking layer 34, a lower light-emitting layer 35, a lower hole blocking layer 36, a lower electron transport layer 37, a n-type charge generating layer 41, a p-type charge generating layer 42, an upper hole transport layer 53, an upper electron blocking layer 54, an upper light-emitting layer 55, an upper hole blocking layer 56, an upper electron transport layer 57, an electron injection layer 58, and an upper electrode 71, all of which are provided in this order. The hole injection layer 32, the lower hole transport layer 33, the lower electron blocking layer 34, the lower hole blocking layer 36, the lower electron transport layer 37, the n-type charge generating layer 41, the p-type charge generating layer 42, the upper hole transport layer 53, the upper electron blocking layer 54, the upper hole blocking layer 56, the upper electron transport layer 57, and the electron injection layer 58 are all charge functional layers that contribute to either one or both of movement and generation of electric charges (electrons and holes).

The hole injection layer 32, the lower hole transport layer 33, the lower electron blocking layer 34, the lower light-emitting layer 35, the lower hole blocking layer 36, and the lower electron transport layer 37 constitute a first layer 30. The upper hole transport layer 53, the upper electron blocking layer 54, the upper light-emitting layer 55, the upper hole blocking layer 56, the upper electron transport layer 57, and the electron injection layer 58 constitute a second layer 50. There is provided a charge generating layer 40 including the n-type charge generating layer (electron generating layer) 41 and the p-type charge generating layer (hole generating layer) 42 between the first layer 30 and the second layer 50. The first layer 30, the charge generating layer 40, and the second layer 50 constitute an organic stack body 60.

Figure 2:
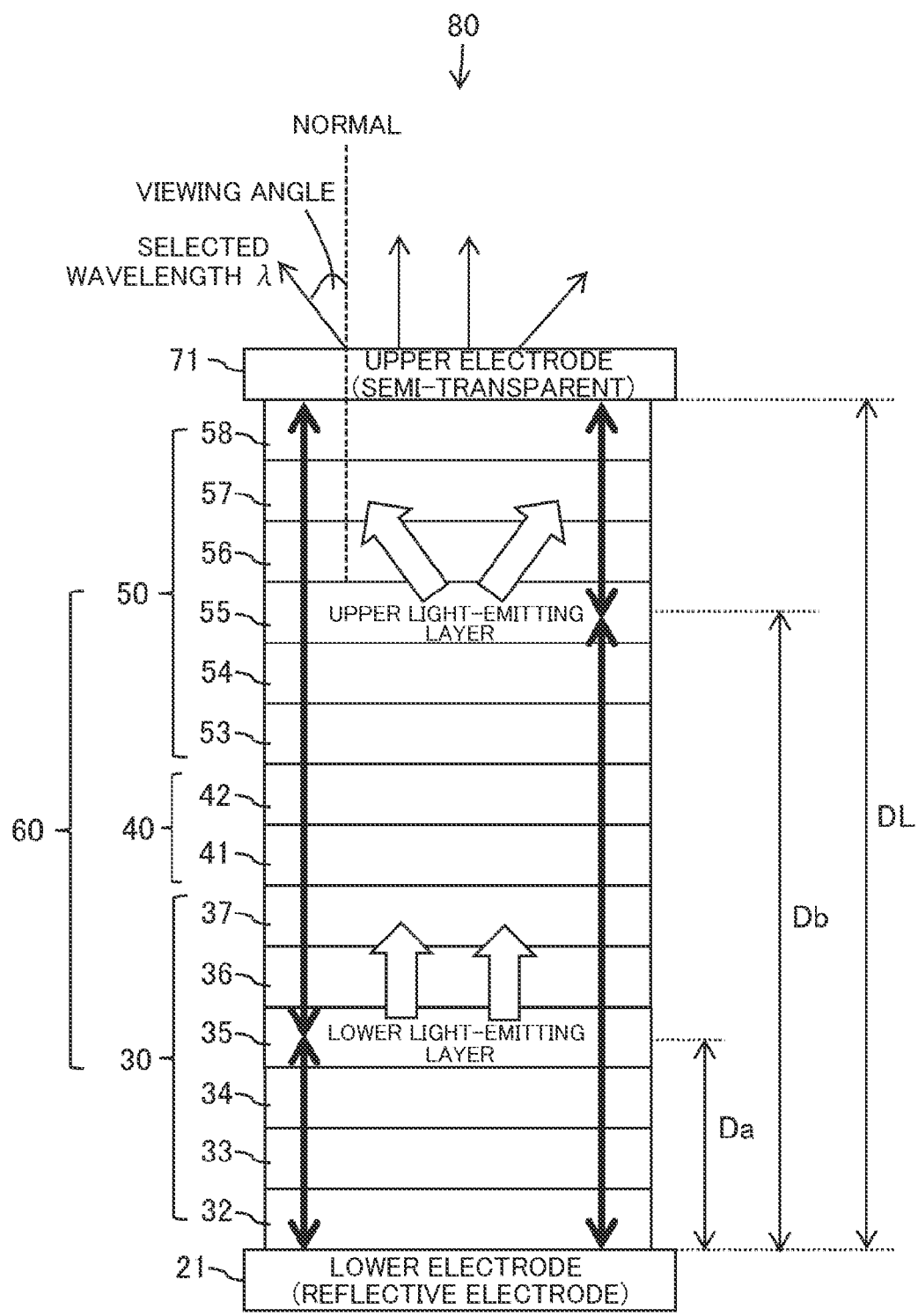
FIG. 2 is a cross-sectional view of light emission by the light-emitting element in accordance with the present embodiment.
Figure 3:
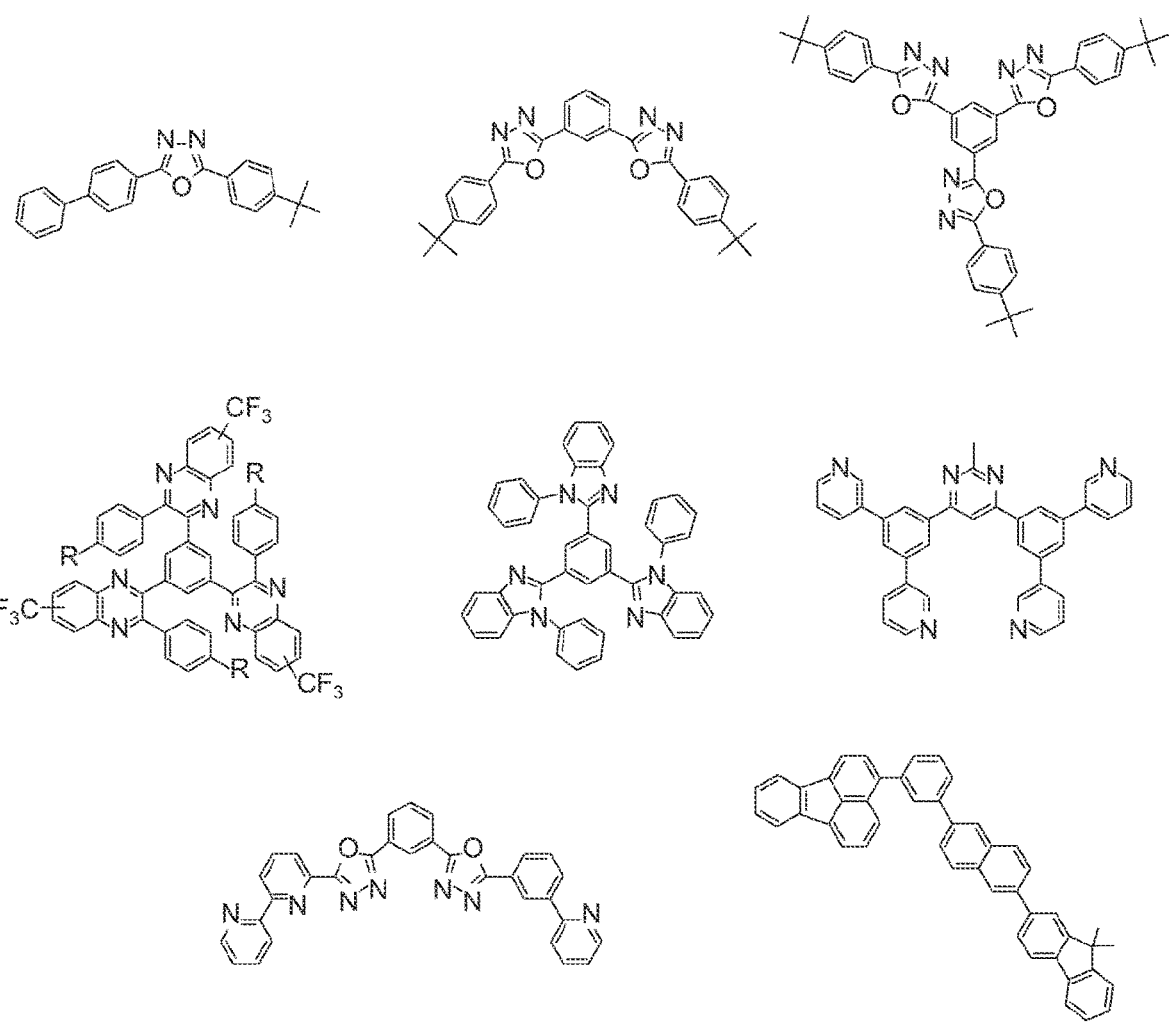
FIG. 3 shows examples of materials used in the light-emitting element.
Figure 4:
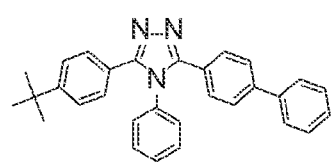
FIG. 4 shows examples of materials used in the light-emitting element.
Figure 4:
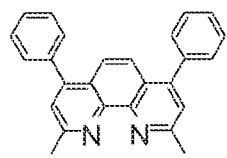
Figure 4:
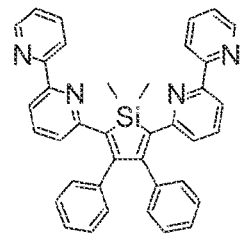
Figure 4:
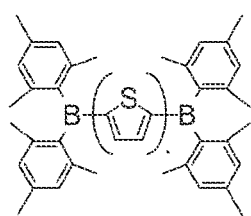
Figure 4:
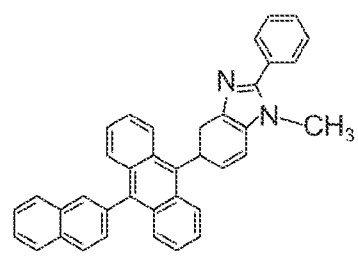

FIG. 2 is a cross-sectional view of light emission by the light-emitting element in accordance with the present embodiment. In the light-emitting element 80, for example, the lower electrode 21 functions as an anode, and the upper electrode 71 functions as a cathode, so that holes are supplied from the lower electrode 21 and that electrons are supplied from the upper electrode 71. Therefore, the n-type charge generating layer 41 generates electrons, and the p-type charge generating layer 42 generates holes. Hence, electrons and holes recombine in the lower light-emitting layer 35 (excitons transition to the ground state) to emit light in a prescribed wavelength range, and electrons and holes recombine in the upper light-emitting layer 55 to emit light in the prescribed wavelength range (light of the same color as the lower light-emitting layer 35).

FIGS. 3 to 8 show examples of materials used in the light-emitting element. Electron transport materials are not limited. For example, any organic electron transport material such as an oxadiazole-based compound (e.g., compound group A in FIG. 3 and compound group B in FIG. 4) may be used. Regarding the n-type charge generating layer 41, a material prepared by adding 5 to 20% Yb (ytterbium) or Li (lithium) to an organic electron transport material may be used. Regarding the lower electron transport layer 37 and the upper electron transport layer 57, a material prepared by mixing an organic electron transport material and Liq (lithium quinoline) at a suitable ratio may be used. As a hole blocking material for the lower hole blocking layer 36 and the upper hole blocking layer 56, an organic electron transport material may be used.

Figure 5:
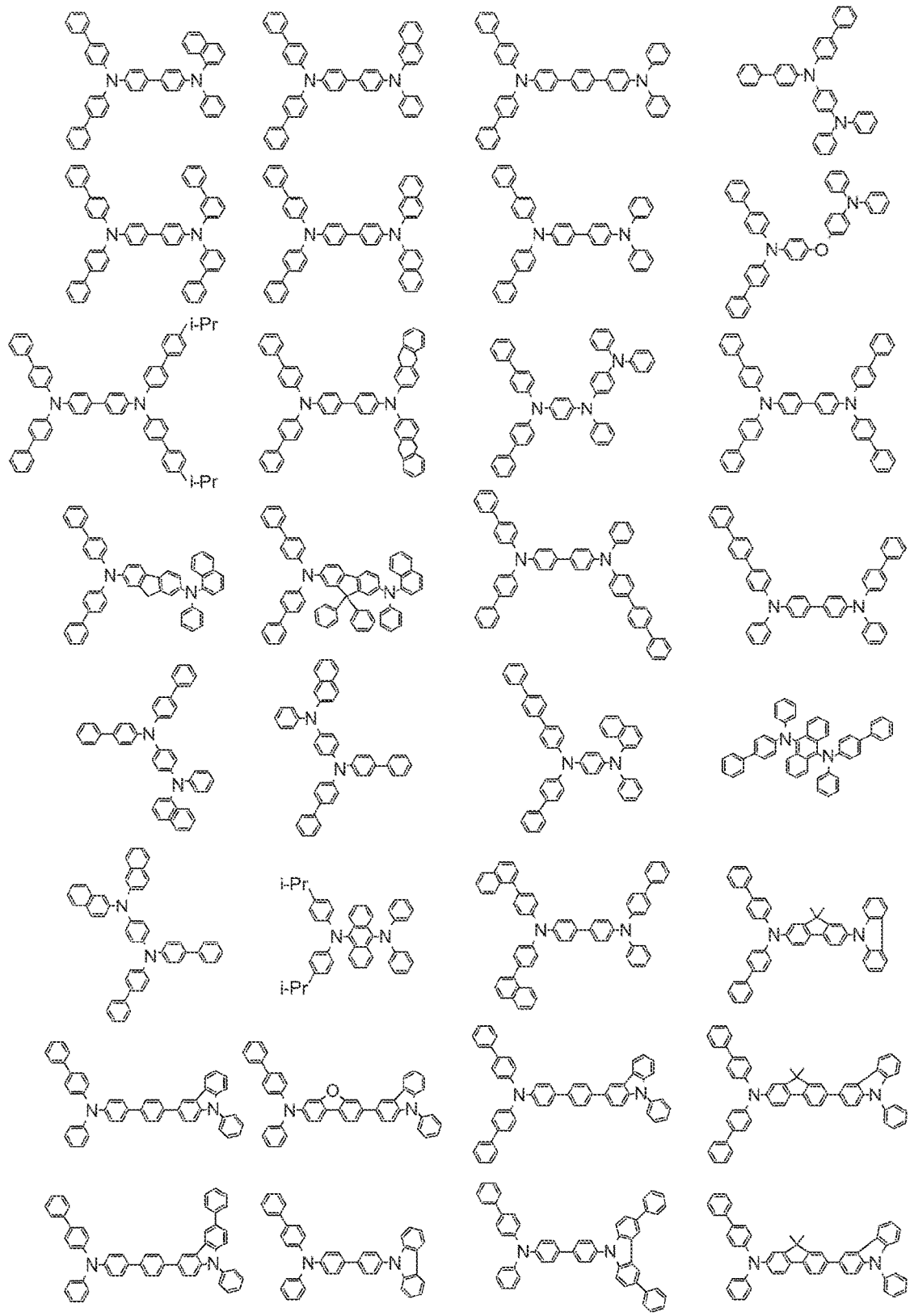
FIG. 5 shows examples of materials used in the light-emitting element.
Figure 6:
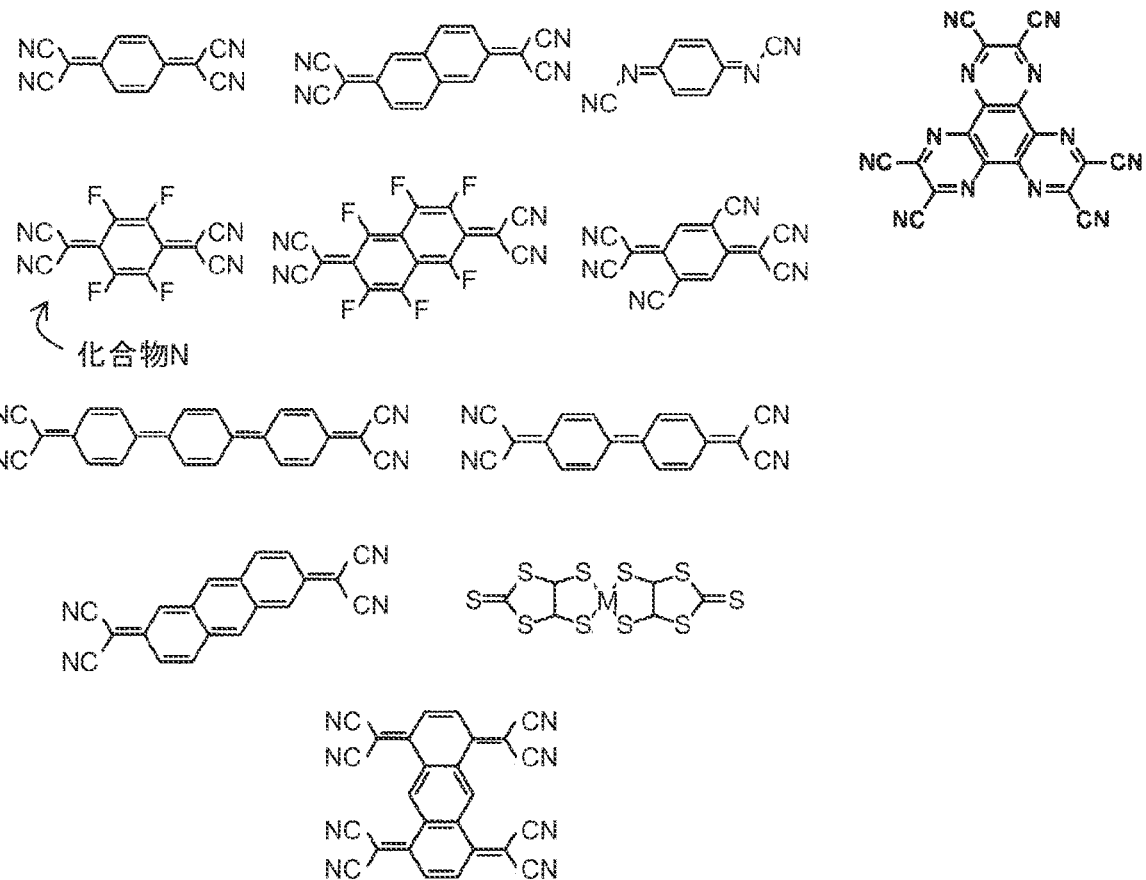
FIG. 6 shows examples of materials used in the light-emitting element.
Figure 7:
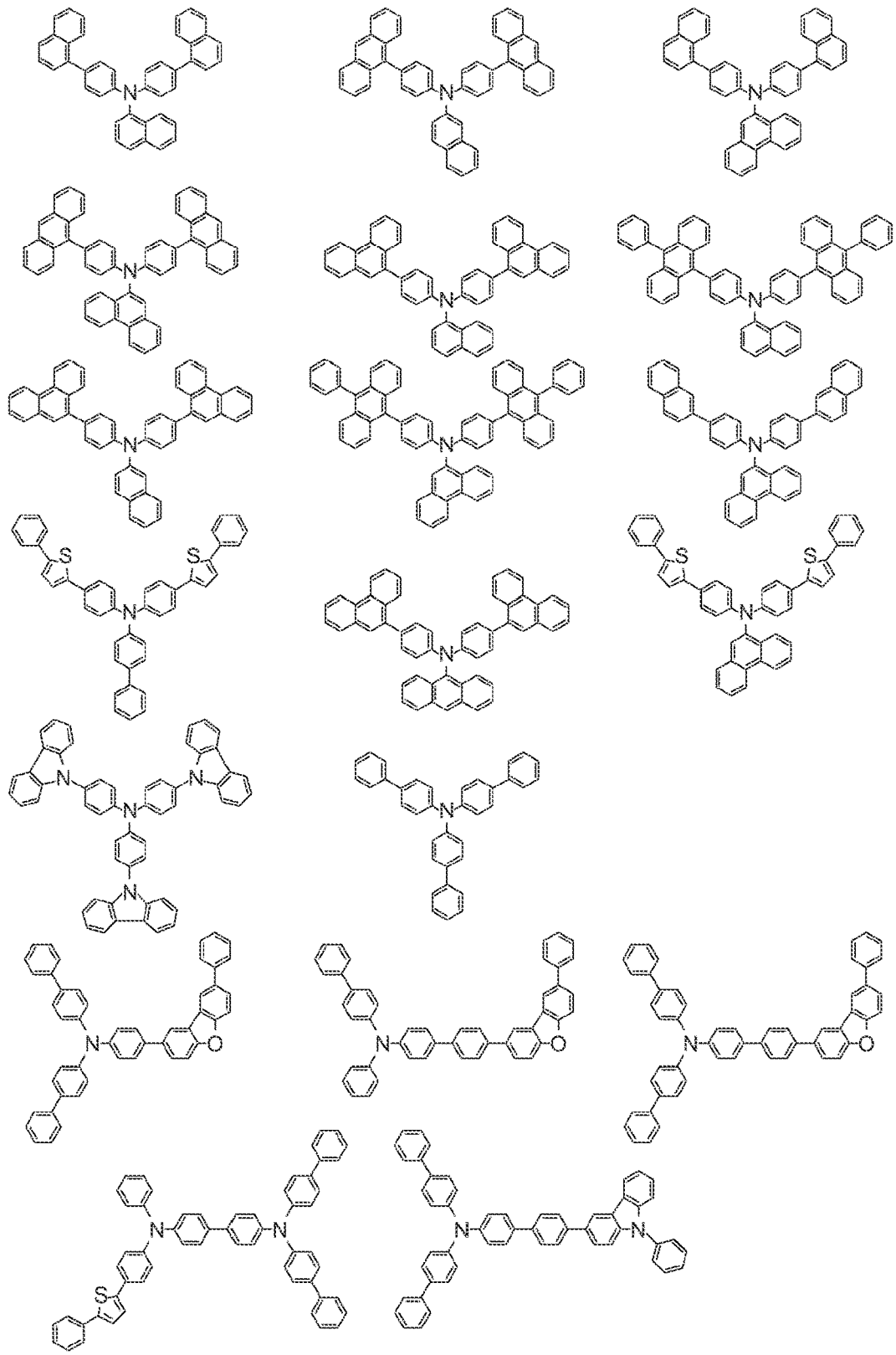
FIG. 7 shows examples of materials used in the light-emitting element.

As an example, Any of the compounds in compound group C in FIG. 5 may be used as an organic hole transport material (electron blocking material). Regarding the p-type charge generating layer 42, a material prepared by adding 1 to 10% electron receiving material to a hole transport material may be used. As an example, any of the compounds in compound group D in FIG. 6 may be used as the electron receiving material, and compound N (TCNQ-4-F) is particularly preferred. The same material may be used as the p-type charge generating layer 42 and the hole injection layer 32. As an example, any of the compounds in compound group E in FIG. 7 may be used as a hole blocking material.

Figure 8:
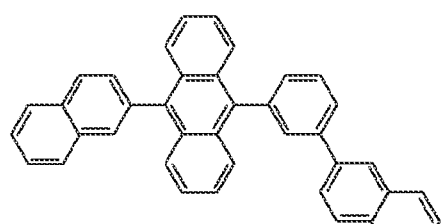
FIG. 8 shows examples of materials used in the light-emitting element.
Figure 8:
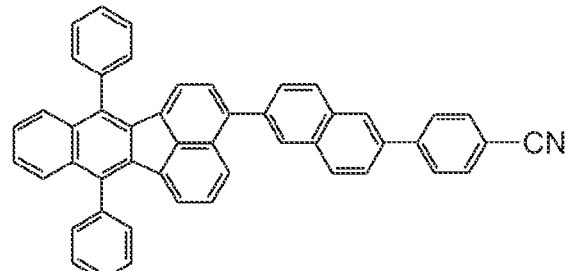
Figure 8:
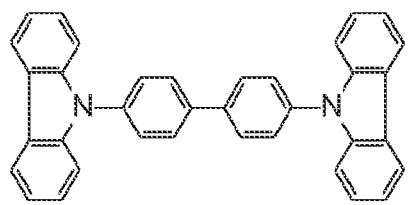
Figure 8:
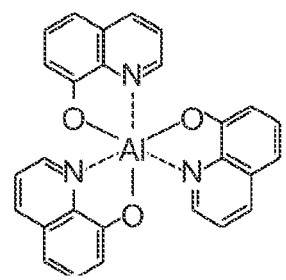
Figure 8:
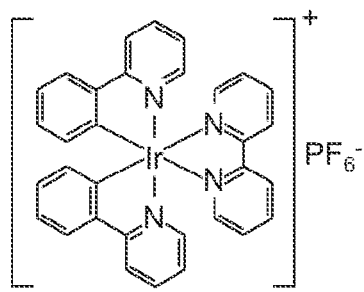
Figure 8:
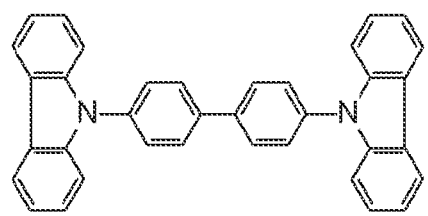
Figure 8:
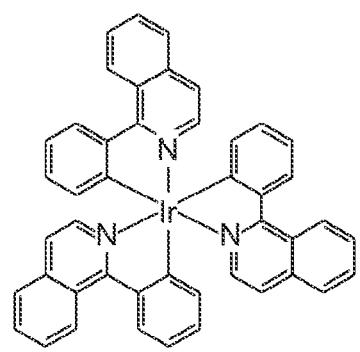

The lower light-emitting layer 35 and the upper light-emitting layer 55 that emit blue light may each contain a host material (e.g., compound 1 in FIG. 8) and a fluorescent dopant material (e.g., compound 2 in FIG. 8). The lower light-emitting layer 35 and the upper light-emitting layer 55 that emit green light may each contain a host material (e.g., compound 3 or compound 4 in FIG. 8) and a phosphorescent dopant material (e.g., compound 5 in FIG. 8). The lower light-emitting layer 35 and the upper light-emitting layer 55 that emit red light may each contain a host material (e.g., compound 6 in FIG. 8) and a phosphorescent dopant material (e.g., compound 7 in FIG. 8).

The lower electrode 21 (e.g., anode) may be, for example, a stack of ITO (indium tin oxide) and either Ag (silver) or a Ag-containing alloy. The upper electrode 71 (e.g., cathode) may be, for example, a metal thin film of, for example, a magnesium-silver alloy.

Referring to FIG. 2, the lower electrode 21 is light-reflective, and the upper electrode 71 is both light-transmissive and light-reflective in such a manner that the upper electrode 71 transmits more light than it reflects light. Therefore, the light-emitting element 80 can achieve a resonance effect regarding the light emitted by each of the lower light-emitting layer 35 and the upper light-emitting layer 55 (of the same wavelength) by forming a macrocavity between the lower electrode 21 and the upper electrode 71. Hence, the intensity of the light that has a selected wavelength increases, thereby increasing the luminance and color purity of the light Specifically, by optimizing (bringing close to resonance conditions) a distance Da between the lower electrode 21 and the lower light-emitting layer 35 (light-emitting point), a distance Db between the lower electrode 21 and the upper light-emitting layer 55 (light-emitting point), and a distance DL between the lower electrode 21 and the upper electrode 71 in accordance with, for example, the selected wavelength for the lower light-emitting layer 35 and the upper light-emitting layer 55, the refractive index of the organic stack body 60, and the phase difference caused by reflection of light by the lower electrode 21, red light has a peak intensity near a selected wavelength of 625 (nm), green light has a peak intensity near a selected wavelength of 535 (nm), and blue light has a peak intensity near a selected wavelength of 460 (nm).

Here, the resonance effect has significant viewing angle dependency. Resonance conditions differ for the vertical viewing angle (viewing angle=0°, visual recognition in the 0° direction with respect to the normal to the light-emitting layer) and for an oblique viewing angle (viewing angle=acute angle, visual recognition in an oblique direction with respect to the normal to the light-emitting layer).

For instance, light with a wavelength λ can achieve a resonance effect at a viewing angle θ when Da satisfies equation 1. Note that m is an integer, Φa is a phase difference caused by reflection of light by the lower electrode 21, n is the refractive index of the organic stack body, and θe is the angle of incidence to the upper electrode 71 when the viewing angle is θ.

$$Da=(m-\Phi a/2\pi)\times\lambda/(2\times n\times\cos\theta e)\qquad\text{Equation 1}$$

In addition, light with a wavelength λ can achieve a resonance effect at the viewing angle θ when Db satisfies equation 2.

$$Db=(m-\Phi a/2\pi)\times\lambda/(2\times n\times\cos\theta e)\qquad\text{Equation 2}$$

In addition, light with a wavelength λ can achieve a resonance effect at the viewing angle θ when DL satisfies equation 3. Note that i is an integer and Φb is a phase difference caused by reflection of light by the upper electrode 71.

$$DL=\{i-(\Phi a-\Phi b)/2\pi\}\times\lambda/(2\times n\times\cos\theta e)\qquad\text{Equation 3}$$

In the present embodiment, a first viewing angle at which the light emitted by the lower light-emitting layer 35 with a selected wavelength achieves a maximum resonance effect differs from a second viewing angle at which the light emitted by the upper light-emitting layer 55 with the selected wavelength achieves a maximum resonance effect. In other words, the first viewing angle is 0°, and the second viewing angle is an acute angle.

Specifically, Da is set such that the resonance effect can reach a maximum at the vertical viewing angle for the lower light-emitting layer 35, and Db is set such that the resonance effect can reach a maximum at an oblique viewing angle for the upper light-emitting layer 55. DL is set such that the resonance effect can reach a maximum at the vertical viewing angle.

Figure 9:
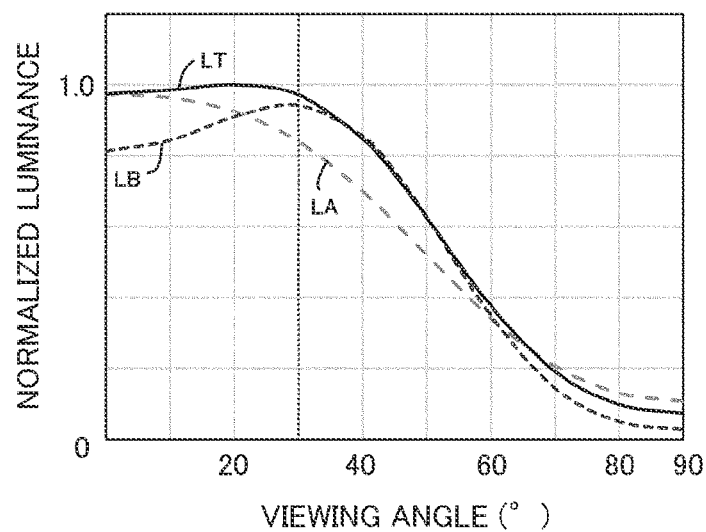
FIGS. 9(a) and 9(b) are graphs representing the viewing angle-normalized luminance characteristics of a lower light-emitting layer and an upper light-emitting layer.
Figure 9:
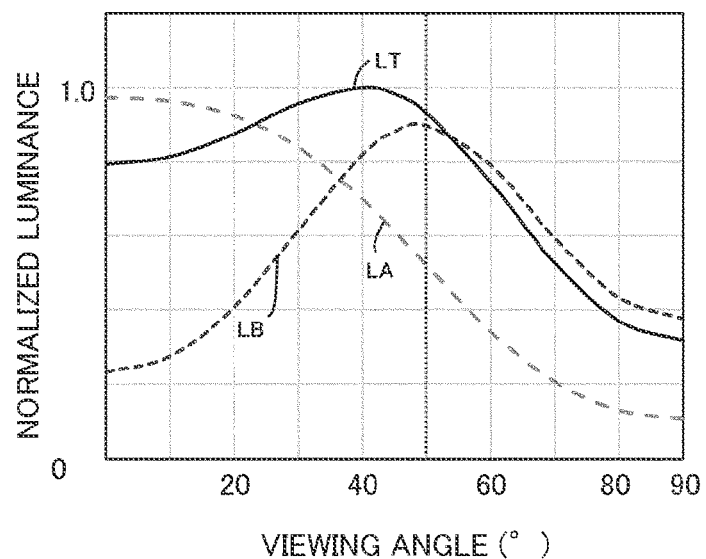

LA in FIG. 9(a) is a normalized luminance of the lower light-emitting layer 35 when Da is set such that the resonance effect can reach a maximum at the vertical viewing angle) (0°). LB in FIG. 9(a) is a normalized luminance of the upper light-emitting layer 55 when Db is set such that the resonance effect can reach a maximum at the oblique viewing angle) (30°). LT in FIG. 9(a) is a normalized luminance of the light-emitting element when Da and Db are set as described above. A comparison of LT with LA in FIG. 5(a) indicates that the luminance properties are improved for viewing angles from 0 to 60° and that the color purity and viewing angle properties are improved.

LA in FIG. 9(b) is a normalized luminance of the lower light-emitting layer 35 when Da is set such that the resonance effect can reach a maximum at the vertical viewing angle) (0°). LB in FIG. 9(b) is a normalized luminance of the upper light-emitting layer 55 when Db is set such that the resonance effect can reach a maximum at the oblique viewing angle) (50°). LT in FIG. 9(b) is a normalized luminance of the light-emitting element when Da and Db are set as described above. A comparison of LT with LA in FIG. 9(b) indicates that although the luminance properties are improved for viewing angles greater than or equal to 25°, the luminance is low at the vertical viewing angle.

Figure 10:
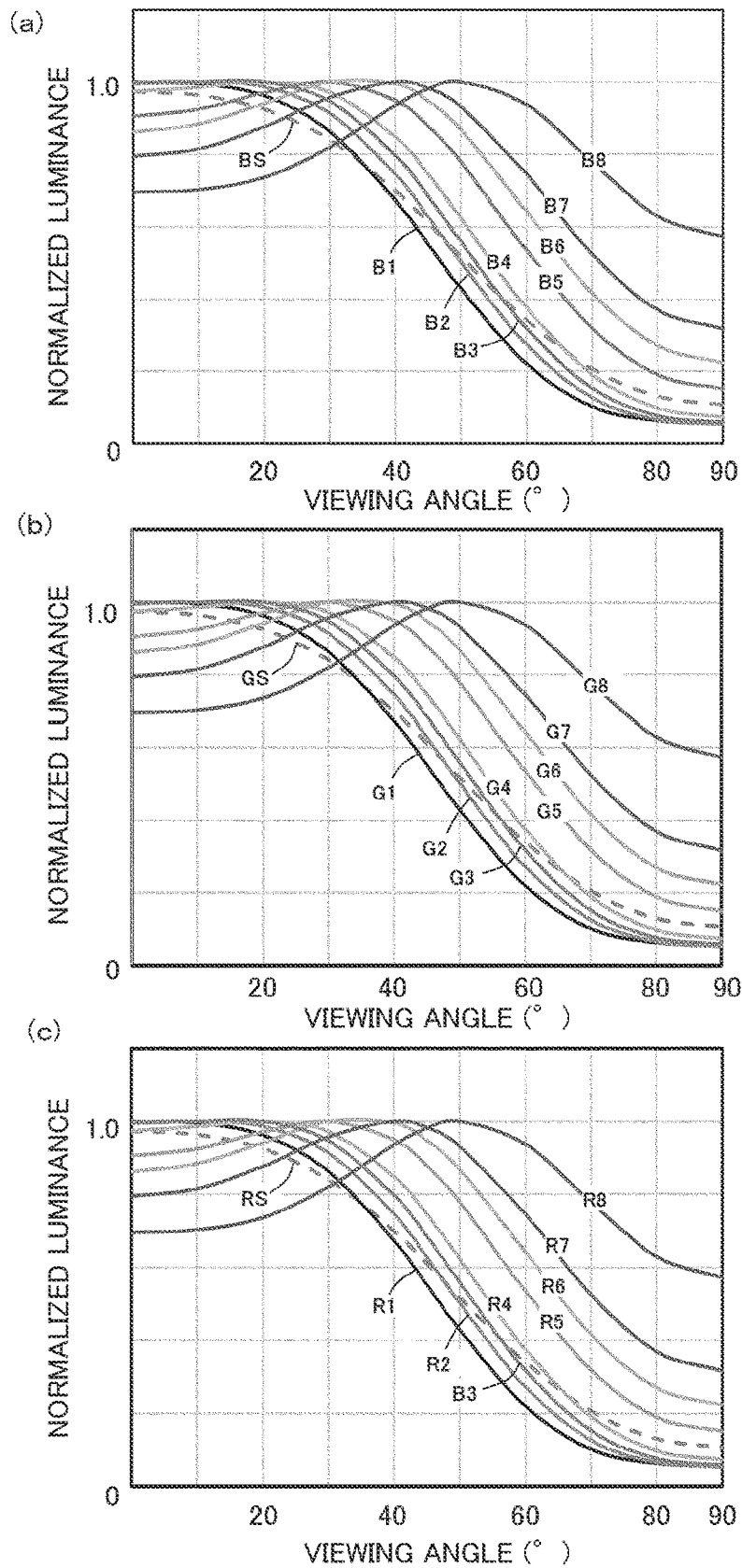
FIG. 10(a) is a graph representing the viewing angle properties of a blue light-emitting element in accordance with the present embodiment.
FIG. 10(b) is a graph representing the viewing angle properties of a green light-emitting element in accordance with the present embodiment.
FIG. 10(c) is a graph representing the viewing angle properties of a red light-emitting element in accordance with the present embodiment.

B1, B2, B3, B4, B5, B6, B7, and B8 in FIG. 10(a) are the normalized luminances of a blue light-emitting element (selected wavelength λ=460 nm) when Da is set such that the resonance effect can reach a maximum at the vertical viewing angle (0°) and Db is set such that the resonance effect can reach a maximum at oblique viewing angles (10°, 20°, 25°, 30°, 40°, 45°, 50°, and 60°) respectively. FIG. 6(a) shows that for the blue light-emitting element, Db is preferably set such that the resonance effect can reach a maximum at an oblique viewing angle of from 20° to 40° (B3 to B5). Specifically, Da is from 116 (nm) to 126 (nm), Db is from 192 (nm) to 212 (nm), and DL is from 220 (nm) to 240 (nm).

G1, G2, G3, G4, G5, G6, G7, and G8 in FIG. 10(b) are the normalized luminances of a green light-emitting element (selected wavelength λ=535 nm) when Da is set such that the resonance effect can reach a maximum at the vertical viewing angle (0°) and Db is set such that the resonance effect can reach a maximum at oblique viewing angles (10°, 20°, 25°, 30°, 40°, 45°, 50°, and 60°) respectively. FIG. 6(b) shows that for the green light-emitting element, Db is preferably set such that the resonance effect can reach a maximum at an oblique viewing angle of from 20° to 40° (G3 to G5). Specifically, Da is from 134 (nm) to 144 (nm), Db is from 222 (nm) to 243 (nm), and DL is from 255 (nm) to 275.

R1, R2, R3, R4, R5, R6, R7, and R8 in FIG. 10(c) are the normalized luminances of a red light-emitting element (selected wavelength λ=625 nm) when Da is set such that the resonance effect can reach a maximum at the vertical viewing angle (0°) and Db is set such that the resonance effect can reach a maximum at oblique viewing angles (10°, 20°, 25°, 30°, 40°, 45°, 50°, and 60°) respectively. FIG. 6(c) shows that for the red light-emitting element, Db is preferably set such that the resonance effect can reach a maximum at an oblique viewing angle of from 20° to 40° (R3 to R5). Specifically, Da is from 158 (nm) to 168 (nm), Db is from 261 (nm) to 284 (nm), and DL is from 298 (nm) to 318 (nm).

Figure 11:
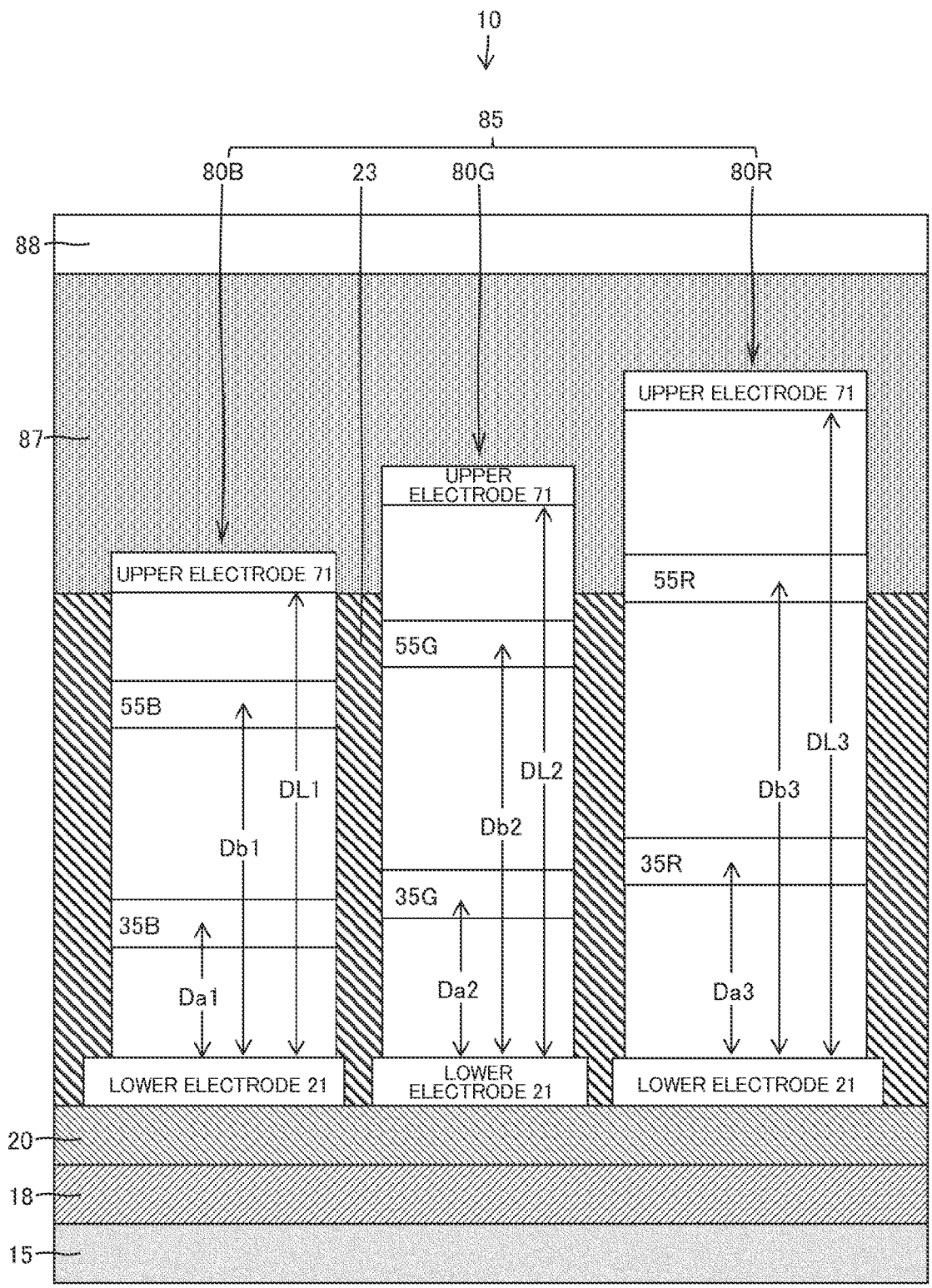
FIG. 11 is a schematic cross-sectional view of a structure of a display device in accordance with the present embodiment.

FIG. 11 is a schematic cross-sectional view of a structure of a display device in accordance with the present embodiment. As shown in FIG. 11, a display device 10 includes: a barrier layer 18; a TFT (thin film transistor) substrate 20 including a pixel circuit; a light-emitting element layer 85 including a blue light-emitting element 80B, a green light-emitting element 80G, and a red light-emitting element 80R; a sealing layer 87; and a functional layer 88, all of which are provided on a substrate 15 in this order.

The substrate 15 is a glass substrate or a flexible substrate made primarily of a resin such as a polyimide. The substrate 15 may be constructed of, for example, two polyimide films and an inorganic film interposed between these polyimide films. The barrier layer 18 may include an inorganic insulating layer for preventing permeation by water, oxygen, and like foreign materials. The TFT layer 20 includes a pixel circuit for controlling the blue light-emitting element 80B, the green light-emitting element 80G, and the red light-emitting element 80R.

The light-emitting element layer 85 includes: the blue light-emitting element 80B; the green light-emitting element 80G; the red light-emitting element 80R; and an insulating edge cover film 23 covering the edge of the lower electrode 21. The edge cover film 23 is formed by, for example, applying an organic material such as a polyimide or an acrylic resin and thereafter patterning the organic material by photolithography. The blue light-emitting element 80B, the green light-emitting element 80G, and the red light-emitting element 80R are, for example, OLEDs (organic light-emitting diodes).

The sealing layer 87, covering the light-emitting element layer 85, is a layer for preventing the permeation of the light-emitting element layer 85 by water, oxygen, and like foreign materials. The sealing layer 87 may be constructed of, for example, two inorganic sealing films and an organic film interposed between these inorganic sealing films. The functional layer 88 has various functions including optical control, touch sensor, and surface protection.

The blue light-emitting element 80B, the green light-emitting element 80G, and the red light-emitting element 80R, all shown in FIG. 11, have the element structure of FIG. 1. In other words, the blue light-emitting element 80B includes the lower electrode 21, the hole injection layer 32, the lower hole transport layer 33, the lower electron blocking layer 34, a lower light-emitting layer 35B corresponding to the lower light-emitting layer 35, the lower hole blocking layer 36, the lower electron transport layer 37, the n-type charge generating layer 41, the p-type charge generating layer 42, the upper hole transport layer 53, the upper electron blocking layer 54, an upper light-emitting layer 55B corresponding to the upper light-emitting layer 55, the upper hole blocking layer 56, the upper electron transport layer 57, the electron injection layer 58, and the upper electrode 71, all of which are provided in this order. The green light-emitting element 80G includes the lower electrode 21, the hole injection layer 32, the lower hole transport layer 33, the lower electron blocking layer 34, a lower light-emitting layer 35G corresponding to the lower light-emitting layer 35, the lower hole blocking layer 36, the lower electron transport layer 37, the n-type charge generating layer 41, the p-type charge generating layer 42, the upper hole transport layer 53, the upper electron blocking layer 54, an upper light-emitting layer 55G corresponding to the upper light-emitting layer 55, the upper hole blocking layer 56, the upper electron transport layer 57, the electron injection layer 58, and the upper electrode 71, all of which are provided in this order. The red light-emitting element 80R includes the lower electrode 21, the hole injection layer 32, the lower hole transport layer 33, the lower electron blocking layer 34, a lower light-emitting layer 35R corresponding to the lower light-emitting layer 35, the lower hole blocking layer 36, the lower electron transport layer 37, the n-type charge generating layer 41, the p-type charge generating layer 42, the upper hole transport layer 53, the upper electron blocking layer 54, an upper light-emitting layer 55R corresponding to the upper light-emitting layer 55, the upper hole blocking layer 56, the upper electron transport layer 57, the electron injection layer 58, and the upper electrode 71, all of which are provided in this order.

The blue light-emitting element 80B is designed, for example, as follows. For the lower light-emitting layer 35B, a distance Da1 to the lower electrode 21 is set such that the resonance effect can reach a maximum at the vertical viewing angle. For the upper light-emitting layer 55B, a distance Db1 to the lower electrode 21 is set such that the resonance effect can reach a maximum at an oblique viewing angle. A distance DL1 between the lower electrode 21 and the upper electrode 71 is set such that the resonance effect can reach a maximum at the vertical viewing angle.

The green light-emitting element 80G is designed, for example, as follows. For the lower light-emitting layer 35G, a distance Da2 to the lower electrode 21 is set such that the resonance effect can reach a maximum at the vertical viewing angle. For the upper light-emitting layer 55G, a distance Db2 to the lower electrode 21 is set such that the resonance effect can reach a maximum at an oblique viewing angle. A distance DL2 between the lower electrode 21 and the upper electrode 71 is set such that the resonance effect can reach a maximum at the vertical viewing angle.

The red light-emitting element 80R is designed, for example, as follows. For the lower light-emitting layer 35R, a distance Da3 to the lower electrode 21 is set such that the resonance effect can reach a maximum at the vertical viewing angle. For the upper light-emitting layer 55R, a distance Db3 to the lower electrode 21 is set such that the resonance effect can reach a maximum at an oblique viewing angle. A distance DL3 between the lower electrode 21 and the upper electrode 71 is set such that the resonance effect can reach a maximum at the vertical viewing angle. Hence, Da1<Da2<Da3, Db1<Db2<Db3, and DL1<DL2<DL3.

This design of the blue light-emitting element 80B, the green light-emitting element 80G, and the red light-emitting element 80R enables each light-emitting element to achieve a microcavity effect (light resonance effect), which in turn enables the resultant display device 10 to exhibit high color purity and good viewing angle properties.

Figure 12:
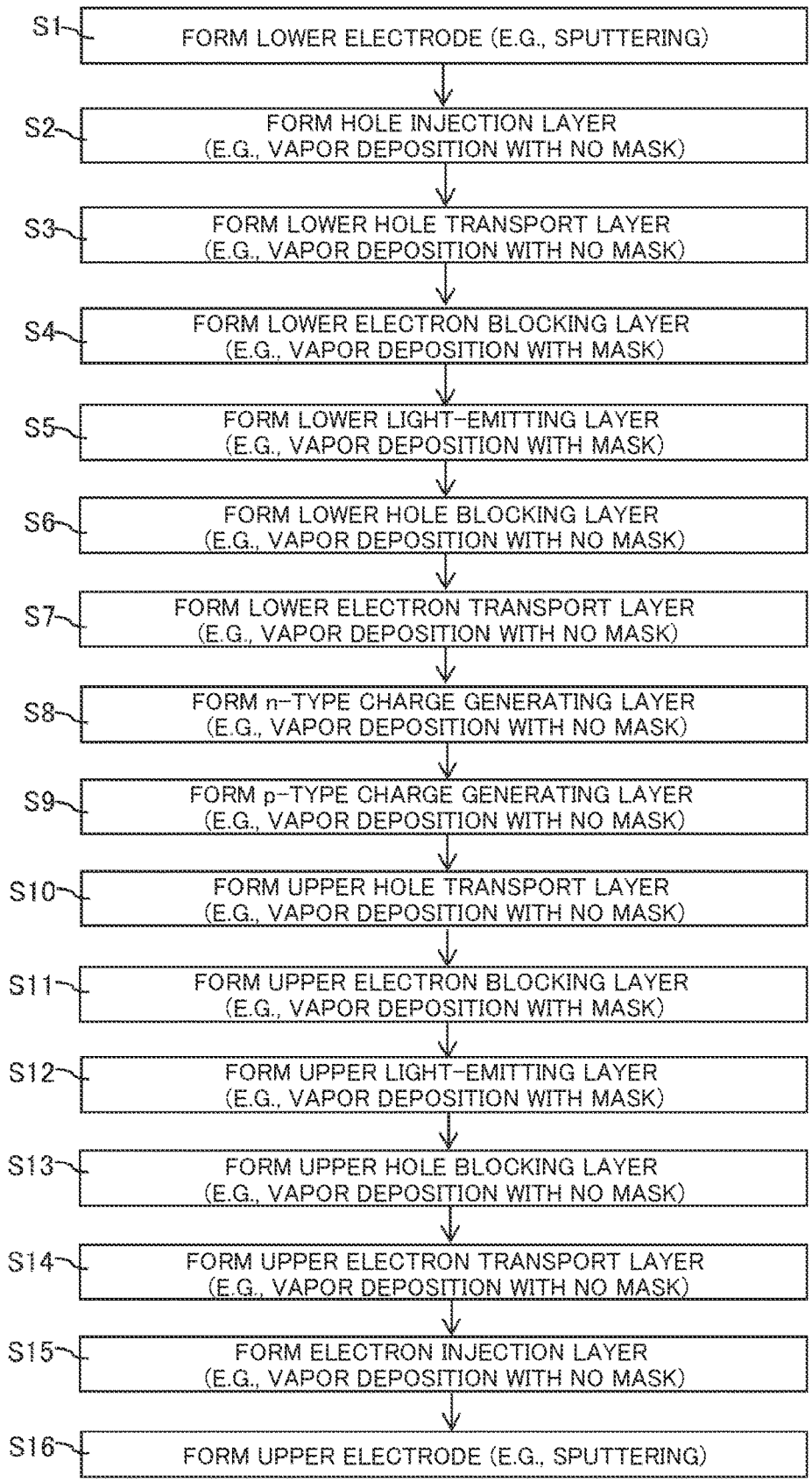
FIG. 12 is a flow chart representing a method of manufacturing multicolor light-emitting elements in the display device.

FIG. 12 is a flow chart representing a method of manufacturing multicolor light-emitting elements in the display device. As shown in FIGS. 1 and 12, the lower electrode 21 is formed in step S1. Specifically, Ag and ITO are sequentially formed by sputtering. The hole injection layer 32 is formed in step S2. Specifically, a hole transport material and an electron receiving material are simultaneously vapor-deposited at a prescribed temperature and also at a prescribed rate. In this example, no fine metal mask is used, so that the hole injection layer 32 is common to the multicolor light-emitting elements. The lower hole transport layer 33 is formed in step S3. Specifically, a hole transport material is vapor-deposited at a prescribed temperature and also at a prescribed rate. In this example, no fine metal mask is used, so that the lower hole transport layer 33 is common to the multicolor light-emitting elements.

The lower electron blocking layer 34 is formed in step S4. Specifically, a hole transport material is vapor-deposited at a prescribed temperature and also at a prescribed rate. In this example, a fine metal mask is used to vapor-deposit the hole transport material to a thickness suited for each color (blue light-emitting element<green light-emitting element<red light-emitting element). The lower light-emitting layer 35 is formed in step S5. Specifically, a light-emitting host and a dopant are simultaneously vapor-deposited at a prescribed temperature and also at a prescribed rate. In this example, a fine metal mask is used to vapor-deposit a material suited for each color.

The lower hole blocking layer 36 is formed in step S6. Specifically, an electron transport material is vapor deposited at a prescribed temperature and also at a prescribed rate. In this example, no fine metal mask is used, so that the lower hole blocking layer 36 is common to the multicolor light-emitting elements. The lower electron transport layer 37 is formed in step S7. Specifically, an electron transport material is vapor-deposited at a prescribed temperature and also at a prescribed rate. An electron transport material and lithium quinoline may be simultaneously vapor-deposited. In this example, no fine metal mask is used, so that the lower electron transport layer 37 is common to the multicolor light-emitting elements.

The n-type charge generating layer 41 is formed in step S8. Specifically, an electron transport material and either Yb or Li are simultaneously vapor-deposited at a prescribed temperature and also at a prescribed rate. In this example, no fine metal mask is used, so that the n-type charge generating layer 41 is common to the multicolor light-emitting elements. The p-type charge generating layer 42 is formed in step S9. Specifically, a hole transport material and an electron receiving material are simultaneously vapor-deposited at a prescribed temperature and also at a prescribed rate. In this example, no fine metal mask is used, so that the p-type charge generating layer 42 is common to the multicolor light-emitting elements.

The upper hole transport layer 53 is formed in step S10. Specifically, a hole transport material is vapor-deposited at a prescribed temperature and also at a prescribed rate. In this example, no fine metal mask is used, so that the upper hole transport layer 53 is common to the multicolor light-emitting elements. The upper electron blocking layer 54 is formed in step S11. Specifically, a hole transport material is vapor-deposited at a prescribed temperature and also at a prescribed rate. In this example, a fine metal mask is used to vapor-deposit the hole transport material to a thickness suited for each color (blue light-emitting element<green light-emitting element<red light-emitting element).

The upper light-emitting layer 55 is formed in step S12. Specifically, a light-emitting host and a dopant are simultaneously vapor-deposited at a prescribed temperature and also at a prescribed rate. In this example, a fine metal mask is used to vapor-deposit a material suited for each color.

The upper hole blocking layer 56 is formed in step S13. Specifically, an electron transport material is vapor-deposited at a prescribed temperature and also at a prescribed rate. In this example, no fine metal mask is used, so that the upper hole blocking layer 56 is common to the multicolor light-emitting elements.

The upper electron transport layer 57 is formed in step S14. Specifically, an electron transport material is vapor-deposited at a prescribed temperature and also at a prescribed rate. An electron transport material and lithium quinoline may be simultaneously vapor-deposited. In this example, no fine metal mask is used, so that the upper electron transport layer 57 is common to the multicolor light-emitting elements.

The electron injection layer 58 is formed in step S15. Specifically, lithium fluoride is vapor-deposited at a prescribed temperature and also at a prescribed rate. In this example, no fine metal mask is used, so that the electron injection layer 58 is common to the multicolor light-emitting elements.

The upper electrode 71 is formed in step S16. Specifically, as an example, a thin film of a magnesium-silver alloy is formed by sputtering.

The foregoing embodiments and examples described so far are for illustrative purposes only and by no means limit the scope of the present invention. It is obvious to the person skilled in the art that many modifications and variations are possible based on the description.

GENERAL DESCRIPTION

Aspect 1

A light-emitting element including: a lower electrode that reflects light; an upper electrode that transmits and reflects light; and a lower light-emitting layer and an upper light-emitting layer both between the lower electrode and the upper electrode, wherein a first viewing angle at which light emitted by the lower light-emitting layer with a selected wavelength achieves a maximum resonance effect differs from a second viewing angle at which light emitted by the upper light-emitting layer with the selected wavelength achieves a maximum resonance effect.

Aspect 2

The light-emitting element of, for example, aspect 1, wherein the light-emitting element is a top-emission type in which light is extracted through an upper side, and the second viewing angle is an acute angle.

Aspect 3

The light-emitting element of, for example, aspect 2, wherein the first viewing angle is 0°.

Aspect 4

The light-emitting element of, for example, aspect 2 or 3, wherein the second viewing angle is from 20° inclusive to 45° exclusive with reference to a normal to the upper light-emitting layer.

Aspect 5

The light-emitting element of, for example, any one of aspects 1 to 4, wherein the lower light-emitting layer is thinner than the upper light-emitting layer.

Aspect 6

The light-emitting element of, for example, any one of aspects 1 to 5, further including a plurality of charge functional layers between the lower electrode and the upper electrode, wherein the plurality of charge functional layers includes a charge generating layer between the lower light-emitting layer and the upper light-emitting layer.

Aspect 7

The light-emitting element of, for example, aspect 6, wherein the charge generating layer includes an electron generating layer and a hole generating layer, and the electron generating layer contains a material prepared by adding ytterbium or lithium to an organic electron transport material.

Aspect 8

The light-emitting element of, for example, aspect 6, wherein an organic stack body of the lower light-emitting layer, the upper light-emitting layer, and the plurality of charge functional layers is provided between the lower electrode and the upper electrode.

Aspect 9

The light-emitting element of, for example, aspect 8, wherein a distance between the lower electrode and the upper light-emitting layer is specified in accordance with the selected wavelength, a refractive index of the organic stack body, and a phase difference caused by reflection of light by the lower electrode.

Aspect 10

The light-emitting element of, for example, aspect 8, wherein the selected wavelength is 460 nm, 535 nm, or 625 nm.

Aspect 11

The light-emitting element of, for example, aspect 10, wherein the refractive index of the organic stack body is from 1.64 to 1.76.

Aspect 12

The light-emitting element of, for example, aspect 5, wherein the lower light-emitting layer has a thickness of 5 (nm) to 20 (nm), and the upper light-emitting layer has a thickness of 15 (nm) to 40 (nm).

Aspect 13

The light-emitting element of, for example, aspect 10, wherein the selected wavelength is 460 nm, a distance between the lower electrode and the lower light-emitting layer is from 116 (nm) to 126 (nm), a distance between the lower electrode and the upper light-emitting layer is from 192 (nm) to 212 (nm), and the organic stack body has a thickness of 220 (nm) to 240 (nm).

Aspect 14

The light-emitting element of, for example, aspect 10, wherein the selected wavelength is 535 nm, a distance between the lower electrode and the lower light-emitting layer is from 134 (nm) to 144 (nm), a distance between the lower electrode and the upper light-emitting layer is from 222 (nm) to 243 (nm), and the organic stack body has a thickness of 255 (nm) to 275 (nm).

Aspect 15

The light-emitting element of, for example, aspect 10, wherein the selected wavelength is 625 nm, a distance between the lower electrode and the lower light-emitting layer is from 158 (nm) to 168 (nm), a distance between the lower electrode and the upper light-emitting layer is from 261 (nm) to 284 (nm), and the organic stack body has a thickness of 298 (nm) to 318 (nm).

Aspect 16

A display device including: the light-emitting element of, for example, aspect 1 wherein the selected wavelength is 625 (nm) as a red light-emitting element; the light-emitting element of, for example, aspect 1 wherein the selected wavelength is 535 (nm) as a green light-emitting element and the light-emitting element of, for example, aspect 1 wherein the selected wavelength is 460 (nm) as a blue light-emitting element.

Aspect 17

The display device of, for example, aspect 16, wherein a distance between the lower electrode and the upper light-emitting layer in the red light-emitting element>a distance between the lower electrode and the upper light-emitting layer in the green light-emitting element>a distance between the lower electrode and the upper light-emitting layer in the blue light-emitting element.

Aspect 18

The display device of, for example, aspect 16, wherein a distance between the lower electrode and the lower light-emitting layer in the red light-emitting element>a distance between the lower electrode and the lower light-emitting layer in the green light-emitting element>a distance between the lower electrode and the lower light-emitting layer in the blue light-emitting element.

Aspect 19

The display device of, for example, aspect 16, wherein a distance between the lower electrode and the upper electrode in the red light-emitting element>a distance between the lower electrode and the upper electrode in the green light-emitting element>a distance between the lower electrode and the upper electrode in the blue light-emitting element.

The invention claimed is:

1. A light-emitting element comprising:
a lower electrode that reflects light;
an upper electrode that transmits and reflects light; and
a lower light-emitting layer and an upper light-emitting layer both between the lower electrode and the upper electrode, wherein
a first viewing angle at which light emitted by the lower light-emitting layer with a selected wavelength achieves a maximum resonance effect differs from a second viewing angle at which light emitted by the upper light-emitting layer with the selected wavelength achieves a maximum resonance effect, wherein the second viewing angle is from 20° inclusive to 45° exclusive with reference to a normal to the upper light-emitting layer.

2. The light-emitting element according to claim 1, wherein the lower light-emitting layer is thinner than the upper light-emitting layer.

3. The light-emitting element according to claim 2, wherein the lower light-emitting layer has a thickness of 5 (nm) to 20 (nm), and the upper light-emitting layer has a thickness of 15 (nm) to 40 (nm).

4. The light-emitting element according to claim 1, further comprising a plurality of charge functional layers between the lower electrode and the upper electrode, wherein the plurality of charge functional layers includes a charge generating layer between the lower light-emitting layer and the upper light-emitting layer, wherein the charge generating layer includes an electron generating layer and a hole generating layer, and the electron generating layer contains a material prepared by adding ytterbium or lithium to an organic electron transport material.

5. The light-emitting element according to claim 4, wherein an organic stack body of the lower light-emitting layer, the upper light-emitting layer, and the plurality of charge functional layers is provided between the lower electrode and the upper electrode.

6. The light-emitting element according to claim 5, wherein a distance between the lower electrode and the upper light-emitting layer is set in accordance with the selected wavelength, a refractive index of the organic stack body, and a phase difference caused by reflection of light by the lower electrode.

7. The light-emitting element according to claim 5, wherein the selected wavelength is 460 nm, 535 nm, or 625 nm.

8. The light-emitting element according to claim 4, wherein the hole generating layer is composed with a hole transport material and an electron-receiving material.

9. A display device comprising:

a red light-emitting element wherein a selected wavelength is 625 (nm);

a green light-emitting element wherein a selected wavelength is 535 (nm); and a blue light-emitting element wherein a selected wavelength is 460 (nm), wherein each of the red light-emitting element, the green light-emitting element, and the blue light-emitting element comprises:

a lower electrode that reflects light;

an upper electrode that transmits and reflects light; and a lower light-emitting layer and an upper light-emitting layer both between the lower electrode and the upper electrode, wherein a first viewing angle at which light emitted by the lower light-emitting layer with the selected wavelength achieves a maximum resonance effect differs from a second viewing angle at which light emitted by the upper light-emitting layer with the selected wavelength achieves a maximum resonance effect.

10. The display device according to claim 9, wherein a distance between the lower electrode and the upper light-emitting layer in the red light-emitting element>a distance between the lower electrode and the upper light-emitting layer in the green light-emitting element>a distance between the lower electrode and the upper light-emitting layer in the blue light-emitting element.

11. The display device according to claim 9, wherein a distance between the lower electrode and the lower light-emitting layer in the red light-emitting element>a distance between the lower electrode and the lower light-emitting layer in the green light-emitting element>a distance between the lower electrode and the lower light-emitting layer in the blue light-emitting element.

12. The display device according to claim 9, wherein a distance between the lower electrode and the upper electrode in the red light-emitting element>a distance between the lower electrode and the upper electrode in the green light-emitting element>a distance between the lower electrode and the upper electrode in the blue light-emitting element.

13. A light-emitting element comprising:

a lower electrode that reflects light;

an upper electrode that transmits and reflects light; and a lower light-emitting layer and an upper light-emitting layer both between the lower electrode and the upper electrode, wherein a first viewing angle at which light emitted by the lower light-emitting layer with a selected wavelength achieves a maximum resonance effect differs from a second viewing angle at which light emitted by the upper light-emitting layer with the selected wavelength achieves a maximum resonance effect, wherein the lower light-emitting layer is thinner than the upper light-emitting layer.

14. The light-emitting element according to claim 13, wherein the second viewing angle is from 20° inclusive to 45° exclusive with reference to a normal to the upper light-emitting layer.

15. The light-emitting element according to claim 13, further comprising a plurality of charge functional layers between the lower electrode and the upper electrode, wherein the plurality of charge functional layers includes a charge generating layer between the lower light-emitting layer and the upper light-emitting layer, wherein the charge generating layer includes an electron generating layer and a hole generating layer, and the electron generating layer contains a material prepared by adding ytterbium or lithium to an organic electron transport material.

16. The light-emitting element according to claim 15, wherein an organic stack body of the lower light-emitting layer, the upper light-emitting layer, and the plurality of charge functional layers is provided between the lower electrode and the upper electrode.

17. The light-emitting element according to claim 16, wherein a distance between the lower electrode and the upper light-emitting layer is set in accordance with the selected wavelength, a refractive index of the organic stack body, and a phase difference caused by reflection of light by the lower electrode.

18. The light-emitting element according to claim 17, wherein the selected wavelength is 460 nm, 535 nm, or 625 nm.

19. The light-emitting element according to claim 15, wherein the hole generating layer is composed with a hole transport material and an electron-receiving material.

20. The light-emitting element according to claim 13, wherein
the lower light-emitting layer has a thickness of 5 (nm) to 20 (nm), and
the upper light-emitting layer has a thickness of 15 (nm) to 40 (nm).

* * * * *